United States Patent [19]
Yoshizawa

[11] Patent Number: 6,037,836
[45] Date of Patent: Mar. 14, 2000

[54] SWITCHED-CAPACITOR AMPLIFIER CIRCUIT

[75] Inventor: Hirokazu Yoshizawa, Tokyo, Japan

[73] Assignee: Seiko Instruments Inc., Japan

[21] Appl. No.: 09/177,812

[22] Filed: Oct. 23, 1998

[30] Foreign Application Priority Data

Oct. 24, 1997 [JP] Japan .................................. 9-292915

[51] Int. Cl.[7] ............................................... H03F 1/02
[52] U.S. Cl. ............................................. 330/9; 330/107
[58] Field of Search ................... 330/9, 51, 107, 330/109; 327/124

[56] References Cited

U.S. PATENT DOCUMENTS

| | | | |
|---|---|---|---|
| 4,331,894 | 5/1982 | Gregorian et al. | 307/520 |
| 4,543,534 | 9/1985 | Temes et al. | 330/9 |
| 5,220,286 | 6/1993 | Nadeem | 330/9 |
| 5,739,720 | 4/1998 | Lee | 330/9 |

*Primary Examiner*—Robert Pascal
*Assistant Examiner*—Henry Choe
*Attorney, Agent, or Firm*—Adams & Wilks

[57] ABSTRACT

A switched-capacitor amplifier circuit produces accurate output signal even if the input signal varies rapidly at every sampling phase. Two capacitors having the same capacitance are connected, in series with the input of an operational amplifier circuit. A switching circuit is connected between a first terminal and ground terminal. The two capacitors are connected with the first terminal.

3 Claims, 9 Drawing Sheets

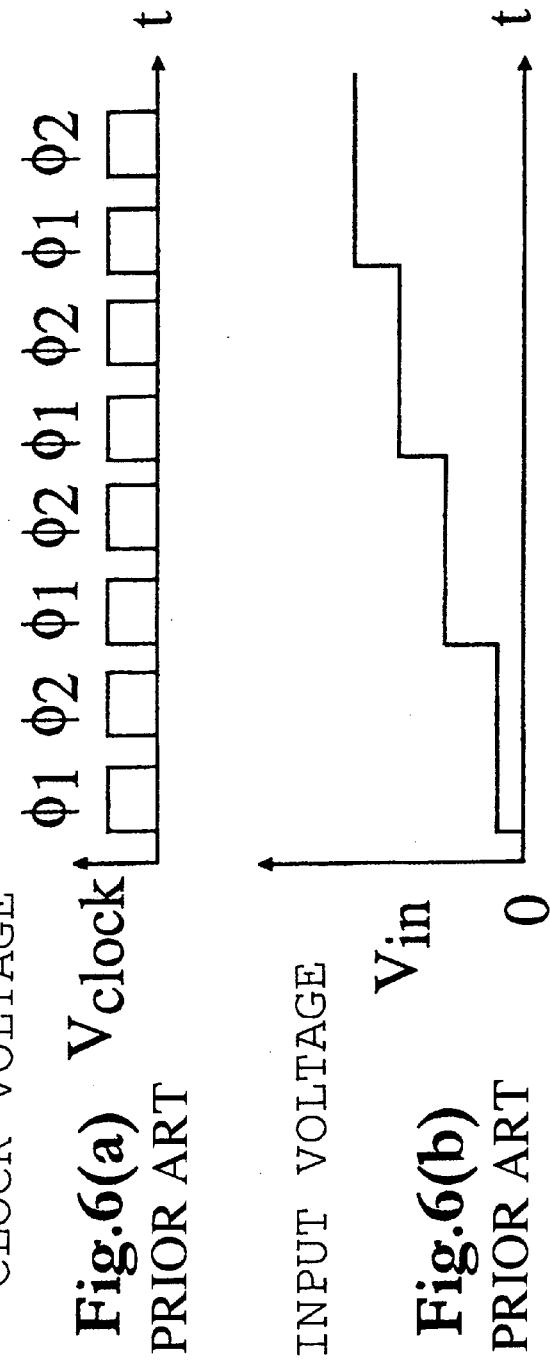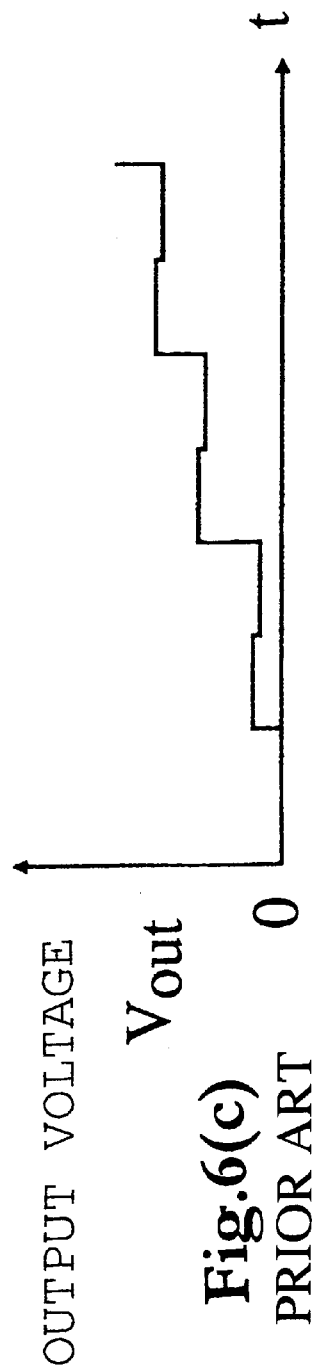
Fig.6(a) PRIOR ART
Fig.6(b) PRIOR ART
Fig.6(c) PRIOR ART

SWITCHED-CAPACITOR AMPLIFIER CIRCUIT

BACKGROUND OF THE INVENTION

The present invention relates to a switched-capacitor amplifier circuit for reducing output variations.

Switched-capacitor amplifier circuit techniques for reducing output variations and alleviating the requirements placed on the slow rate of an operational amplifier have been heretofore reported. Such a switched-capacitor amplifier circuit is described by Haug, K., Temes, G. C., and Martin, K. W., in "Improved Offset-Compensation Schemes for Switched-Capacitor Circuits", Proceeding of IEEE International Symposium on Circuits and Systems, pp. 1054–1057, 1984 (hereinafter referred to as paper 1).

A conventional switched-capacitor amplifier circuit is shown in FIG. 5. Clock voltage, input voltage, and output voltage used in this switched-capacitor amplifier circuit are shown in FIGS. 6(a)–(c), where the value of the output voltage Vout at sampling phase $\phi_1$ is almost equal to the value assumed at the previous clock pulse $\phi_2$ where the input voltage Vin varies mildly. That is, the value of the output voltage is kept almost constant.

In the circuit of FIG. 5, a capacitor 4 is used to sample the input voltage. A capacitor 2 is used to amplify and deliver the sample input voltage. The gain is the ratio of the capacitance of the capacitor 4 to the capacitance of the capacitor 2. Another capacitor 3 is used to provide negative feedback to the operational amplifier 1 on clock pulse $\phi_2$.

Switching circuits 6, 8, and 10 are closed at sampling phase $\phi_1$ (FIG. 6(a)). The input voltage Vin (FIG. 6(b)) is stored as electric charge in the capacitor 4. The capacitor 2 is discharged via the switching circuit 8. The capacitor 3 is connected between the input and output terminals of the operational amplifier 1 to provide negative feedback to this amplifier.

During the phase $\phi_2$, the output is valid, and the switching circuits 6, 8, and 10 are opened, while the switching circuits 7, 9, and 11 are closed. At this time, the charge stored in the capacitor 4 is transferred to the capacitor 2. The output Vout (FIG. 6(c)) that is the product of the gain (that is given by the ratio of the capacitance of the capacitor 2 to the capacitance of the capacitor 4) and the input voltage Vin is produced at an output terminal 14.

At the next sampling phase $\phi_1$, new input voltage is stored as electric charge in the capacitor 4. At this time, electric charge is transferred from the capacitor 4 to the capacitor 3 via the switching circuit 6 according to the magnitude and polarity of the input voltage Vin. At the same time, electric charge stored in the capacitor 2 is released at $\phi_1$ and transferred to the capacitor 3 via the switching circuit 6. Where the frequency of the input signal is much smaller than the clock frequency, the electric charges transferred from the capacitors 2 and 4 to the capacitor 3 are opposite in polarity but almost identical in amount. Therefore, these electric charges cancel out. Consequently, the output voltage Vout at the sampling phase $\phi_1$ is almost equal to the output voltage at the valid phase $\phi_2$.

Another switched-capacitor amplifier circuit is described in a paper presented by Gregorian, R., Martin, K., Temes, G. C., in "Switched Capacitor Circuit Design", Proceedings of IEEE, Vol. 71, pp.941–966, 1983. This circuit is shown in FIG. 8. Clock voltage, input voltage, and output voltage used in this circuit are shown in FIGS. 9(a)–(c), where the output voltage Vout returns to 0 V at every sampling phase $\phi_1$ when the input voltage Vin varies mildly.

Switching circuits 6, 8, and 10 are closed at sampling phase $\phi_1$ (FIG. 9(a)). The input voltage Vin (FIG. 9(b)) is stored as electric charge in a capacitor 4. A capacitor 2 is discharged through the switching circuit 8. The switching circuit 6 is connected between the input and output terminals of the operational amplifier 1 to provide negative feedback to the amplifier 1. At the sampling phase $\phi_1$, the switching circuit 6 is closed and so the potential at the output terminal 14 becomes equal to the potential at a virtual grounding terminal 15.

During the phase $\phi_2$, the output is valid, and the switching circuits 6, 8, and 10 are opened, while the switching circuits 9 and 11 are closed. At this time, the charge stored in the capacitor 4 is transferred to the capacitor 2. The output Vout (FIG. 9(c)) that is the product of the gain (that is given by the ratio of the capacitance of the capacitor 2 to the capacitance of the capacitor 4) and the input voltage Vin is produced at an output terminal 14.

At the next sampling phase $\phi_1$, a new input voltage is stored as electric charge in the capacitor 4. The switching circuit 6 is again closed. The potential at the output terminal 14 becomes equal to the potential at a virtual grounding terminal 15. In this way, in this circuit, the output voltage Vout becomes equal to the virtual grounding potential at every sampling phase $\phi_1$. Therefore, the output voltage Vout varies greatly. Hence, the slow rate of the operational amplifier is required to be set large.

In the conventional switched-capacitor amplifier circuit (FIG. 5) described in the aforementioned paper 1, the output voltage at the sampling phase $\phi_1$ is almost equal to the output voltage at the valid phase $\phi_2$. Therefore, the requirement, i.e., the slow rate of the operational amplifier must be set large, can be mitigated.

In the conventional switched-capacitor amplifier circuit shown in FIG. 5, if the frequency of the input signal is considerably lower than the sampling frequency as shown in FIG. 6(b), electric charges transferred from the capacitors 2 and 4 to the capacitor 3 are opposite in polarity at clock pulse $\phi_1$ but equal in amount. Therefore, these charges cancel out. The output voltage Vout hardly varies. However, as the frequency of the input signal rises as shown in FIG. 7(b), the amounts of electric charge transferred from the capacitors 2 and 4 to the capacitor 3 at clock pulse $\phi_1$ (FIG. 7(a)) produce a greater difference. This difference appears as output voltage Vout (FIG. 7(c)) at output terminal 14 through the capacitor 3. In consequence, the output voltage Vout at sampling phase $\phi_1$ varies to a larger extent. The result is that the output produces an error.

In the conventional switched-capacitor amplifier circuit shown in FIG. 5, it is assumed that the positive power-supply voltage is 1.5 V, the negative power-supply voltage is −1.5 V, and the analog ground is 0 V. For simplicity, it is assumed that the capacitors 2, 3, and 4 have the same capacitance of C. Clock pulses, input voltage, and output voltage are shown in FIG. 6. When the input voltage is −1.0 V at clock pulse $\phi_1$, the electric charge stored in the capacitor 4 is given by $$Q_4 = C \times (0\ V - (-1.0\ V)) = C \times (1\ V)$$

Electric charge stored in the capacitor 2 is given by $$Q_2 = C \times (0\ V - 0\ V) = 0$$

Meanwhile, electric charge stored in the capacitor 3 is given by $$Q_3 = C \times (0\ V - Vout)$$

At the next clock pulse $\phi_2$, the capacitor 4 discharges, and the positive charge stored on the side of the virtual grounding terminal 15 of the capacitor 4 is transferred to the capacitor 2. Therefore, the voltage developed across the capacitor 2 is given by $$V_2 = Q_4/C = 1 \text{ V}$$

Thus, the output voltage Vout is $$\text{Vout} = 0 \text{ V} - V_2 = 0 \text{ V} - 1 \text{ V} = -1 \text{ V}$$

In this way, an output voltage equal to the input voltage is obtained.

Electric charge stored in the capacitor 3 is given by $$Q_3 = C \times (0 \text{ V} - \text{Vout}) = C \times (1 \text{ V})$$

If the input voltage is 1.0 V at the next clock pulse $\phi_1$, electric charge corresponding to $$C \times (1.0 \text{ V} - 0 \text{ V})$$

$$C \times (1 \text{ V})$$

is transferred from the capacitor 4 to the capacitor 3. At the same time, the capacitor 2 discharges, and its electric charge is fully transferred from the capacitor 2 to the capacitor 3. The amount of charge correspond to $$C \times V_2 = C \times (1 \text{ V})$$

Since electric charge corresponding to $C \times (1 \text{ V})$ was stored in the capacitor 3 at clock pulse $\phi_2$, electric charge corresponding to $C \times (3 \text{ V})$ is stored in the capacitor 3. Therefore, the output voltage goes toward $$\text{Vout} = 0 \text{ V} - 3 \text{ V} = -3 \text{ V}$$

Since the output from the operational amplifier 1 cannot decrease below the negative power-supply voltage of −1.5 V, the potential at the virtual grounding terminal 15 shifts in the forward direction from analog ground 0 V. Consequently, the charge stored in each capacitor at clock pulse $\phi_1$ deviates greatly from the ideal value. For this reason, electric charge is not precisely transferred at the next clock pulse $\phi_2$. As a result, the output voltage Vout involves a great error.

SUMMARY OF THE INVENTION

In view of the foregoing problems, it is an object of the present invention to provide a switched-capacitor amplifier circuit in which two capacitors having the same capacitance are connected in series on the input side. In this amplifier circuit, if the frequency of the input signal increases, one of the two input capacitors acts as a buffer. Rapid variations of the input signal hardly affect the output at every sampling phase. Consequently, error can be prevented.

In order that rapid variations in the input signal hardly affect the output at every sampling phase, the capacitance on the input side of the switched-capacitor amplifier circuit is formed by two capacitors connected in series. One of the two input capacitors serves as a buffer. A switch is connected to the junction of the two input capacitors to form a dc path, thus preventing leakage current from accumulating in the parasitic capacitances of the two capacitors.

The switched-capacitor amplifier circuit can be built as a two-input, two-output, fully differential type using a two-input, two-output operational amplifier. The in-phase component-eliminating action of the operational amplifier can effectively reduce the in-phase clock feedthrough and noises.

Preferably, the dependence of the capacitors used in the circuit described above on voltage is small. It is desired to use capacitors having two layers of polysilicon.

In the switched-capacitor amplifier circuit constructed as described above, if the input signal varies rapidly at every sampling phase, one of the two input capacitors acts as a buffer. The output voltage is not affected. Therefore, no error is produced. Hence, accurate output voltage is obtained.

Other objects and features of the invention will appear in the course of the description thereof, which follows.

BRIEF DESCRIPTION OF THE DRAWINGS

FIG. 2(*b*) is a time chart of an input voltage applied to the switched-capacitor amplifier circuit shown in FIG. 1;

FIG. 2(*c*) is a time chart of the output voltage from the switched-capacitor amplifier circuit shown in FIG. 1;

FIG. 6(*a*) is a time chart of clock pulses used in the switched-capacitor amplifier circuit shown in FIG. 5;

FIG. 6(*b*) is a time chart of an input voltage applied to the switched-capacitor amplifier circuit shown in FIG. 5, and in which the voltage varies mildly;

FIG. 6(*c*) is a time chart of the output voltage from the switched-capacitor amplifier circuit shown in FIG. 5;

FIG. 7(*b*) is an input voltage applied to the switched-capacitor amplifier circuit shown in FIG. 5, and in which the voltage has a high frequency and varies rapidly;

FIG. 7(*c*) is a time chart of the output voltage from the switched-capacitor amplifier circuit shown in FIG. 5 in response to the input voltage shown in FIG. 7(*b*);

FIG. 9(*b*) is a time chart of an input voltage applied to the switched-capacitor amplifier circuit shown in FIG. 9(*a*); and FIG. 9(*c*) is a time chart of the output voltage from the circuit shown in FIG. 9(*a*)) in response to the input voltage shown in FIG. 9(*b*).

DETAILED DESCRIPTION OF THE PREFERRED EMBODIMENTS

Figure 1:
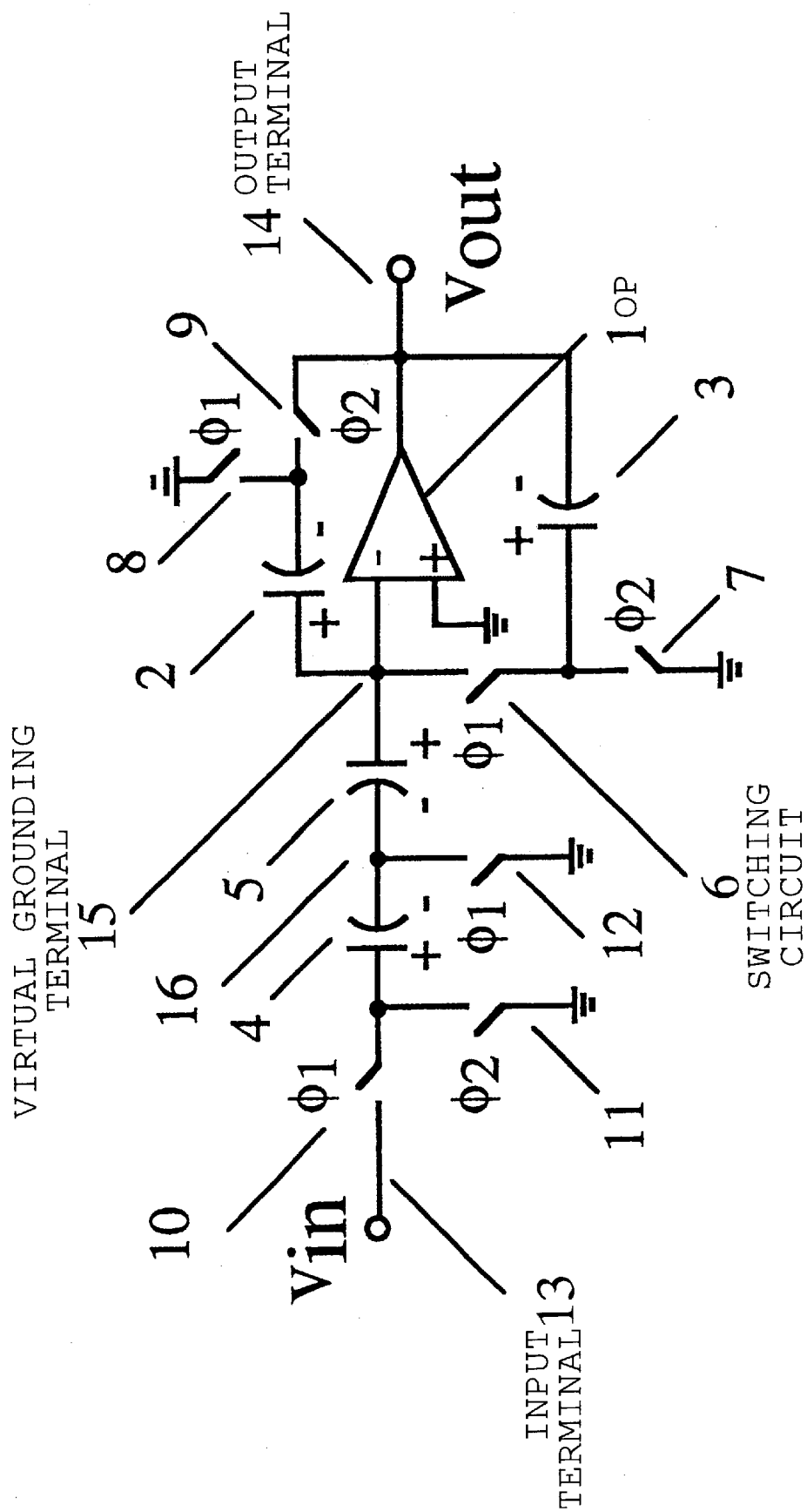
FIG. 1 is a circuit diagram of a switched-capacitor amplifier circuit in accordance with the present invention.
Figure 5:
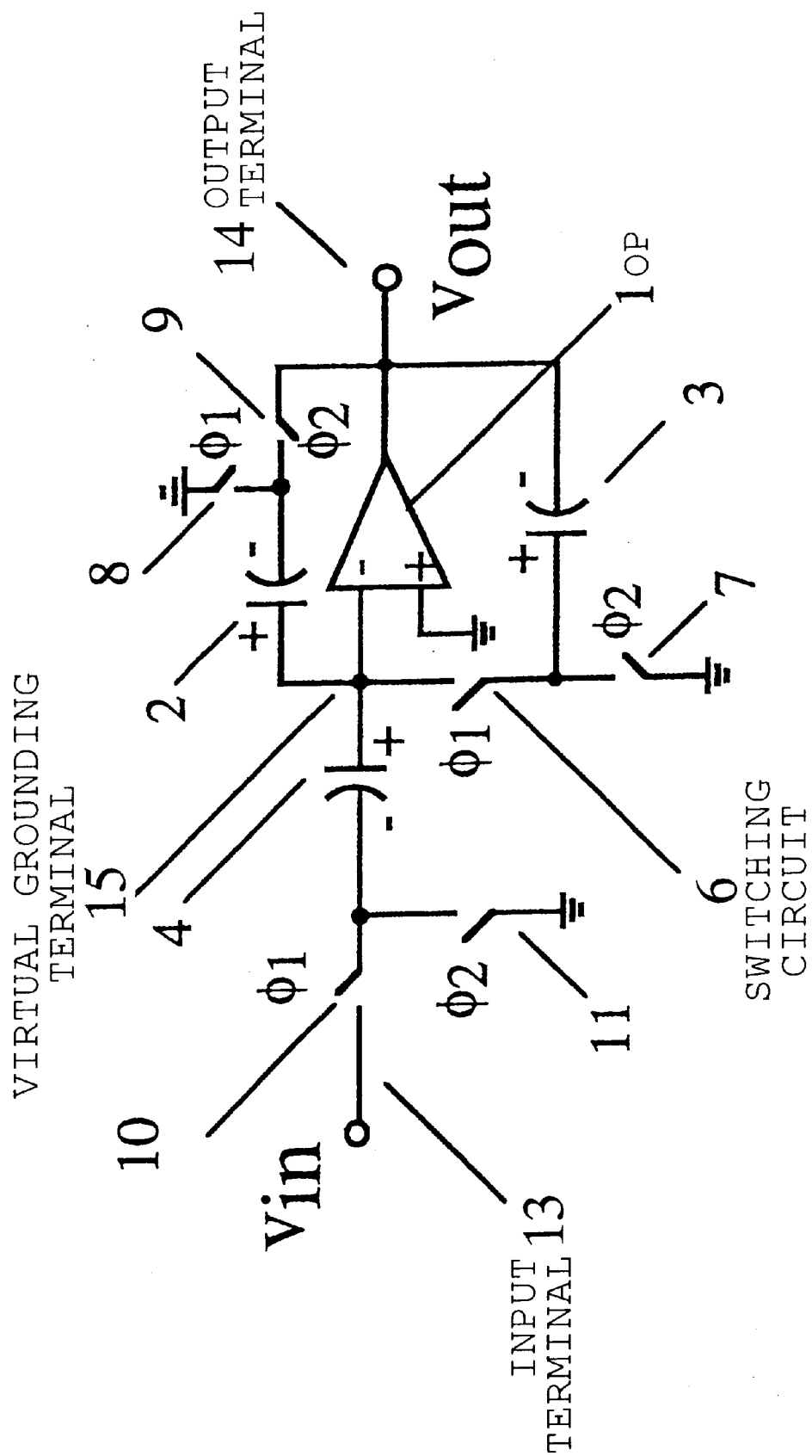
FIG. 5 is a circuit diagram of a conventional switched-capacitor amplifier circuit.
Figure 7A:
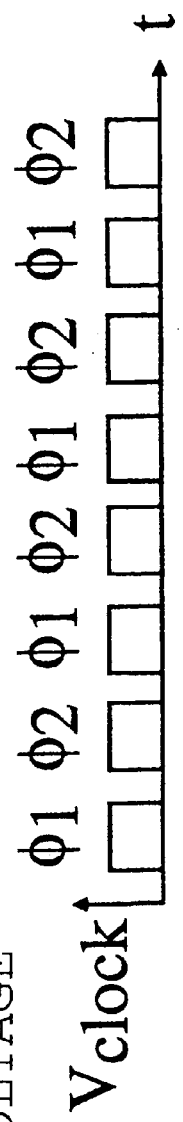
FIG. 7(*a*) is a time chart of clock pulses used in the switched-capacitor amplifier circuit shown in FIG. 5.
Figure 7B:
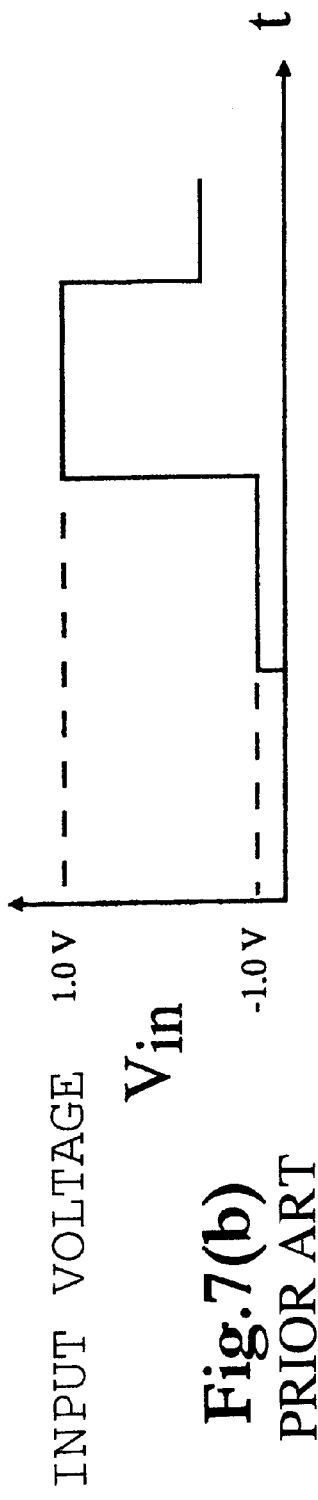
Figure 7C:
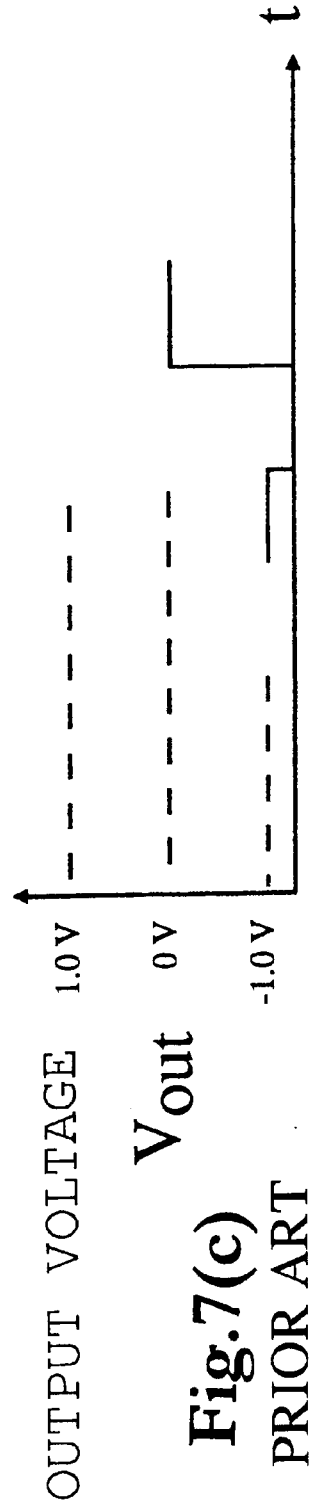
Figure 8:
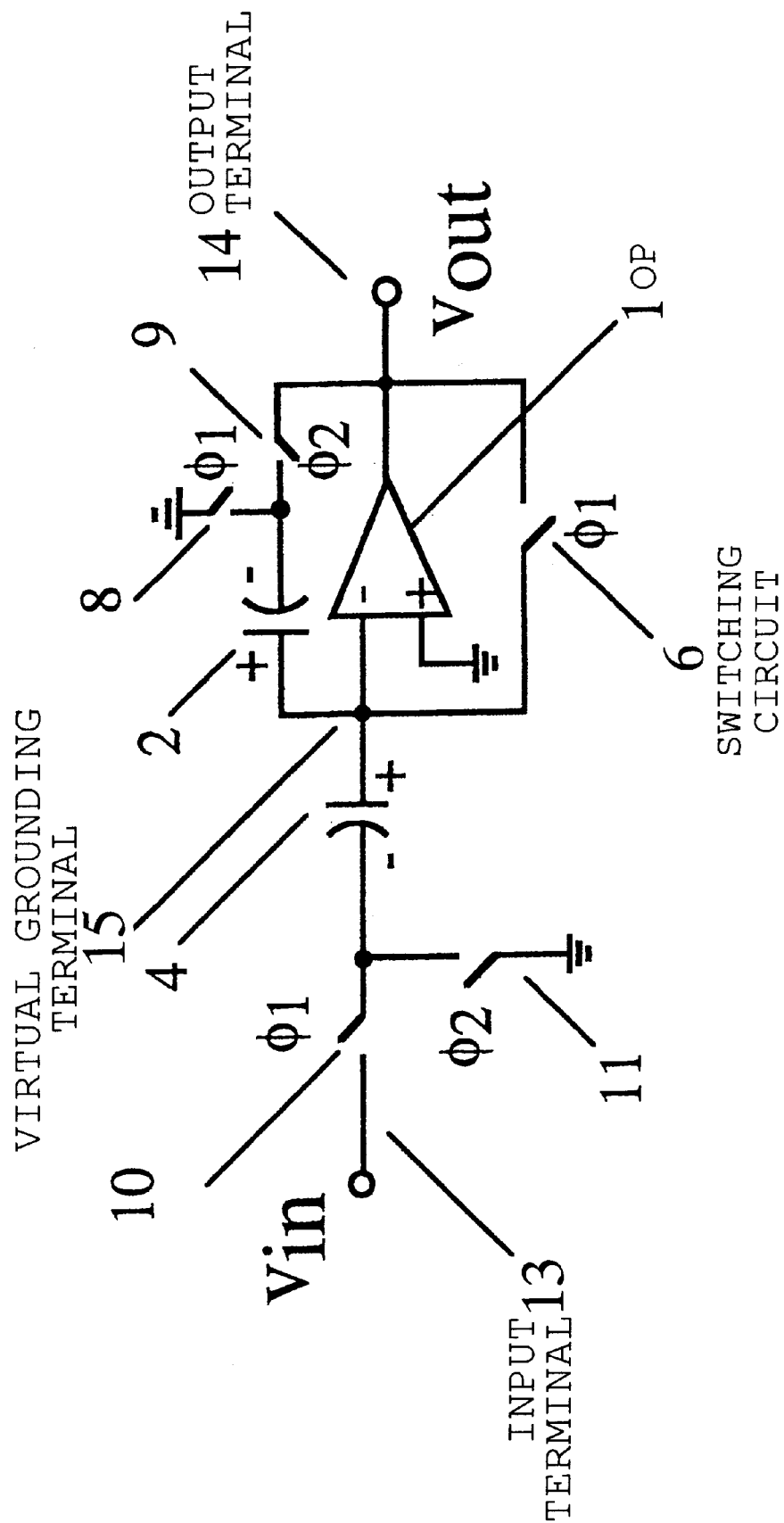
FIG. 8 is a circuit diagram of another conventional switched-capacitor amplifier circuit.
Figure 9A:
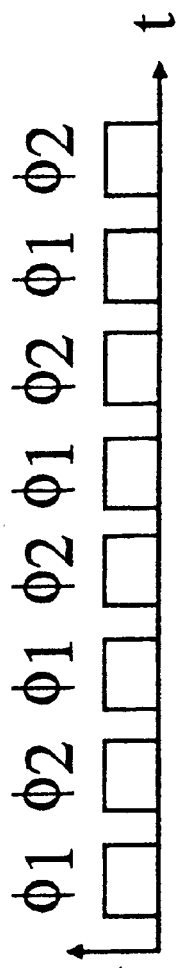
FIG. 9(*a*) is a time chart of clock pulses used in the switched-capacitor amplifier circuit shown in FIG. 8.
Figure 9B:
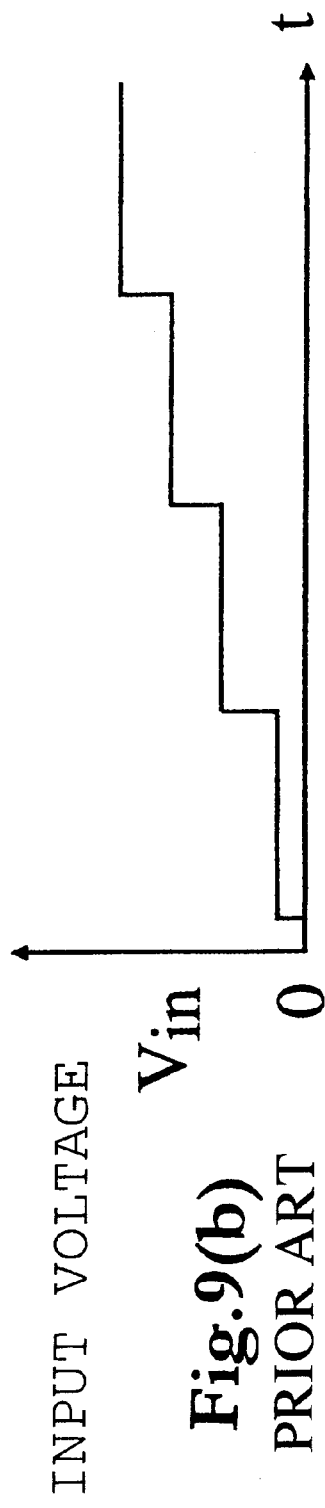
Figure 9C:
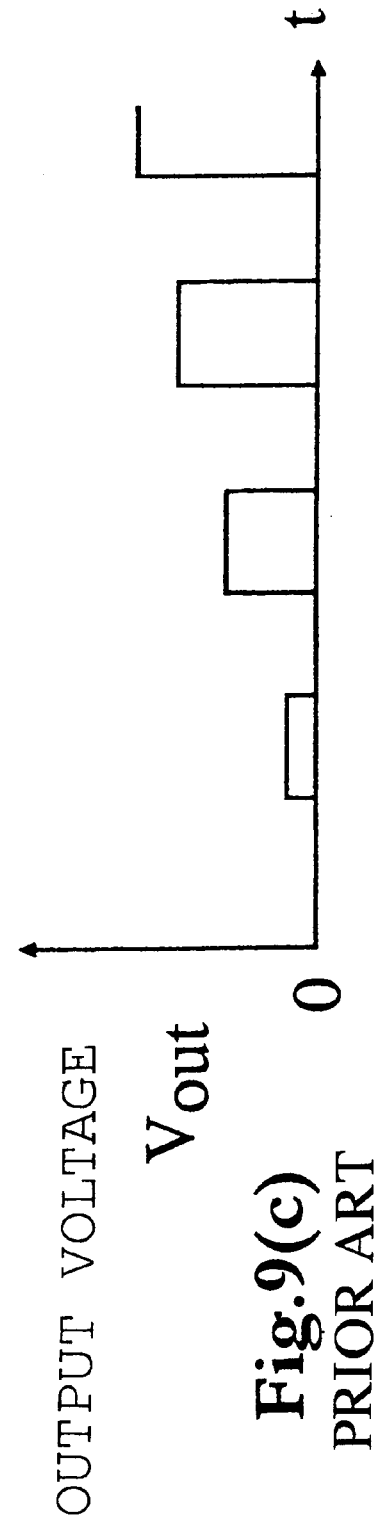

Referring to FIG. 1, there is shown a switched-capacitor amplifier circuit in accordance with the present invention. It is assumed that the positive power-supply voltage is 1.5 V, the negative power-supply voltage is −1.5 V, and the analog ground is 0 V, in the same way as in the conventional switched-capacitor amplifier circuit already described in connection with FIG. 5. Assume that capacitors 2, 3, 4, and 5 satisfy relations given by $$2C_2 = 2C_3 = C_4 = C_5 = 2C$$

Figure 2A:
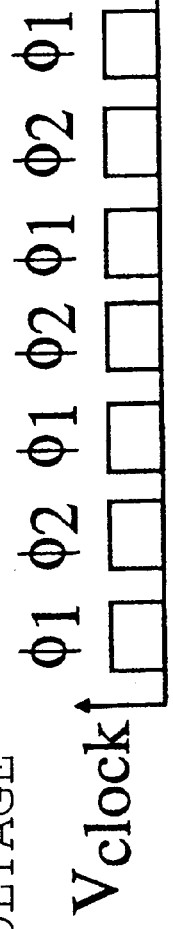
FIG. 2(*a*) is a time chart of clock pulses in the switched-capacitor amplifier circuit shown in FIG. 1.
Figure 2B:
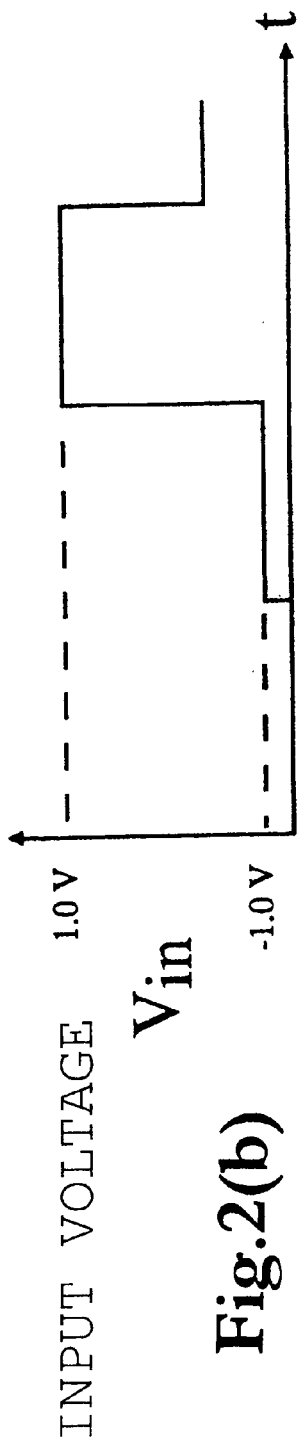
Figure 2C:
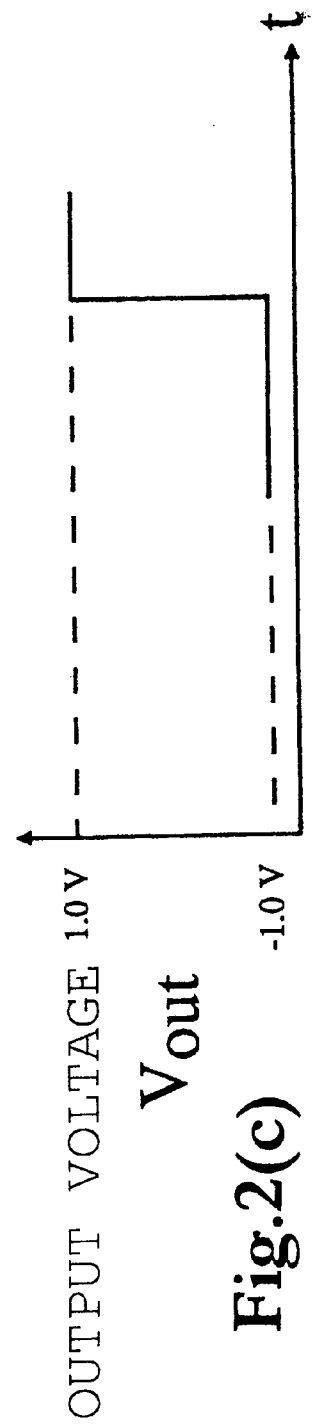

Applied clock pulses are shown in FIG. 2(a). A voltage applied to the circuit is shown in FIG. 2(b). An output voltage from the circuit is shown in FIG. 2(c). When the input voltage is −1.0 V at clock pulse $\phi_1$ (FIG. 2(a), electric charge stored in the capacitor 4 is given by $$Q_4=2C\times(-1.0\ V-0\ V)=2C\times(-1\ V)$$

Meanwhile, electric charge stored in the capacitor 5 is given by $$Q_5=2C\times(0\ V-0\ V)=0$$

Electric charge stored in the capacitor 2 is given by $$Q_2=C\times(0\ V-0\ V)=0$$

Electric charge stored in the capacitor 3 is given by $$Q_3=C\times(0\ V-Vout)$$

At the next clock pulse $\phi_2$, a switching circuit 12 is opened, so that a terminal 16 becomes a node of high impedance. Electric charge is redistributed between the capacitors 4 and 5. The change $\Delta V_{16}$ in the voltage at the terminal 16 connected to the capacitors 4 and 5 is given by $$\Delta V_{16}=(0\ V-Vin)/2=(0\ V-(-1.0\ V))/2=0.5\ V$$

The amount of change $\Delta Q_5$ in the charge stored in the capacitor 5 is transferred to the capacitor 2. $\Delta Q_5$ is given by $$\Delta Q_5=2C\bullet\Delta V_{16}$$

Therefore, the amount of change $\Delta Q_2$ in the voltage developed across the capacitor 2 is given by $$\Delta V_2=\Delta Q_5/C=2C\bullet\Delta V_{16}/G=1.0\ V$$

Since the output voltage Vout (FIG. 2(c) is the difference between the virtual ground potential and $\Delta V_2$, we have $$Vout=0\ V-1.0\ V=-1.0\ V$$

Thus, the input voltage is taken from the output terminal 14.

It is now assumed that the input voltage reaches 1.0 V at the next clock pulse $\phi_1$. The potential at the terminal 16 drops from 0.5 V to 0 V at clock pulse $\phi_2$. At this time, electric charge corresponding to $$2C\times(-0.5\ V)$$

is transferred from the capacitor 5 to the capacitor 3. At the same time, electric charge correspond to $$C\times(0\ V-(-1.0\ V))=C\times(1\ V)$$

is transferred from the capacitor 2 to the capacitor 3. The sum of these charges is zero. Accordingly, the amount of charge corresponding to $C\times(1\ V)$ and already stored in the capacitor 3 does not vary. Consequently, the output voltage is kept at Vout=−1.0 V. Accordingly, the potential at the virtual grounding terminal 15 is maintained at analog ground level. In this way, in the circuit according to the present invention, if the input voltage Vin varies rapidly, the analog ground level does not change, unlike in the conventional circuit. In consequence, the output voltage Vout can be obtained precisely.

Figure 3:
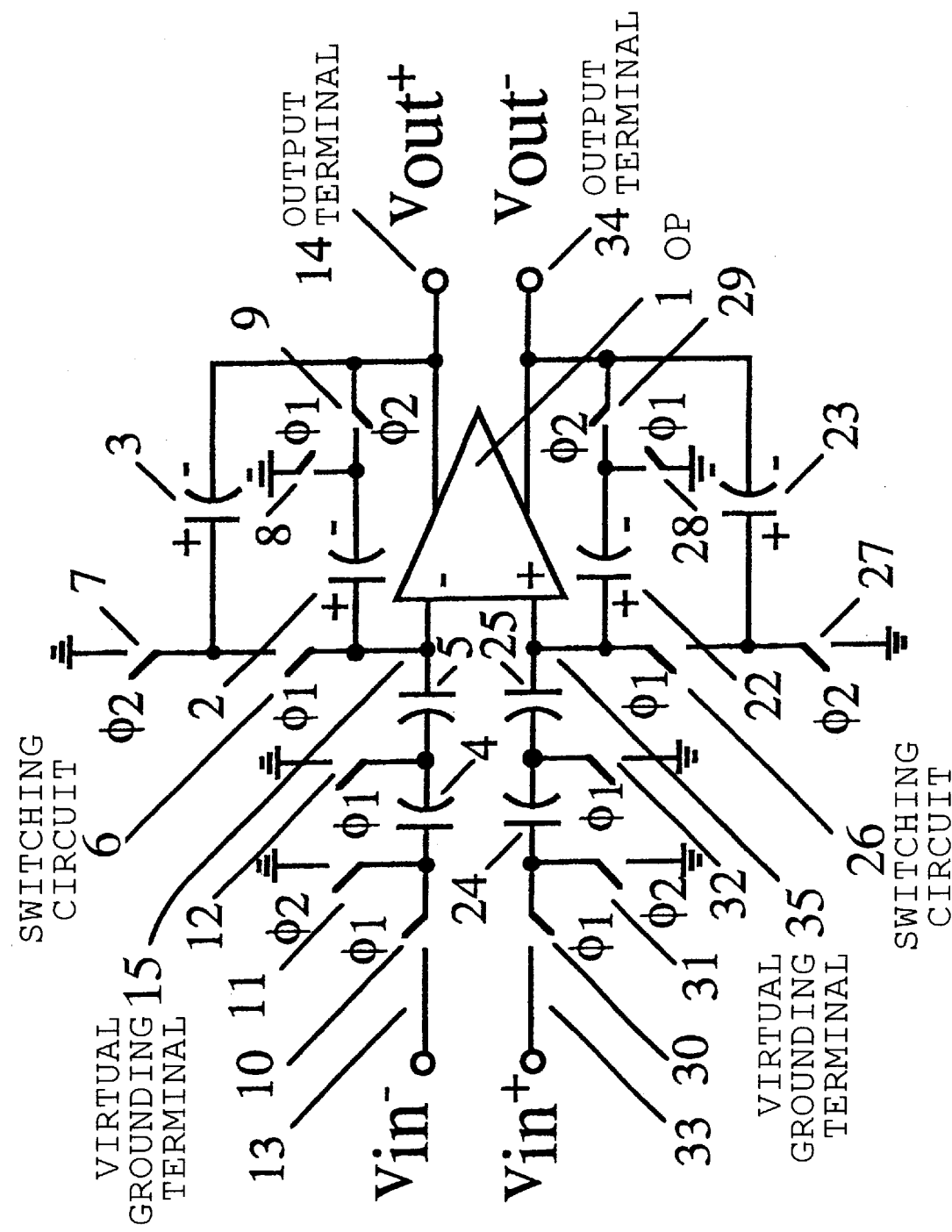
FIG. 3 is a circuit diagram of another switched-capacitor amplifier circuit in accordance with the invention.

In the embodiment shown in FIG. 3, two paths are formed for the input and the output, respectively, of an operational amplifier. Each path comprises an input circuit portion and a feedback circuit portion. The input circuit portion consists of a switch and a capacitor. These two circuit paths are identical in circuit configuration with the circuit shown in FIG. 1. Therefore, the in-phase component-removing action of the operational amplifier can reduce the in-phase clock feedthrough and noises.

Figure 4:
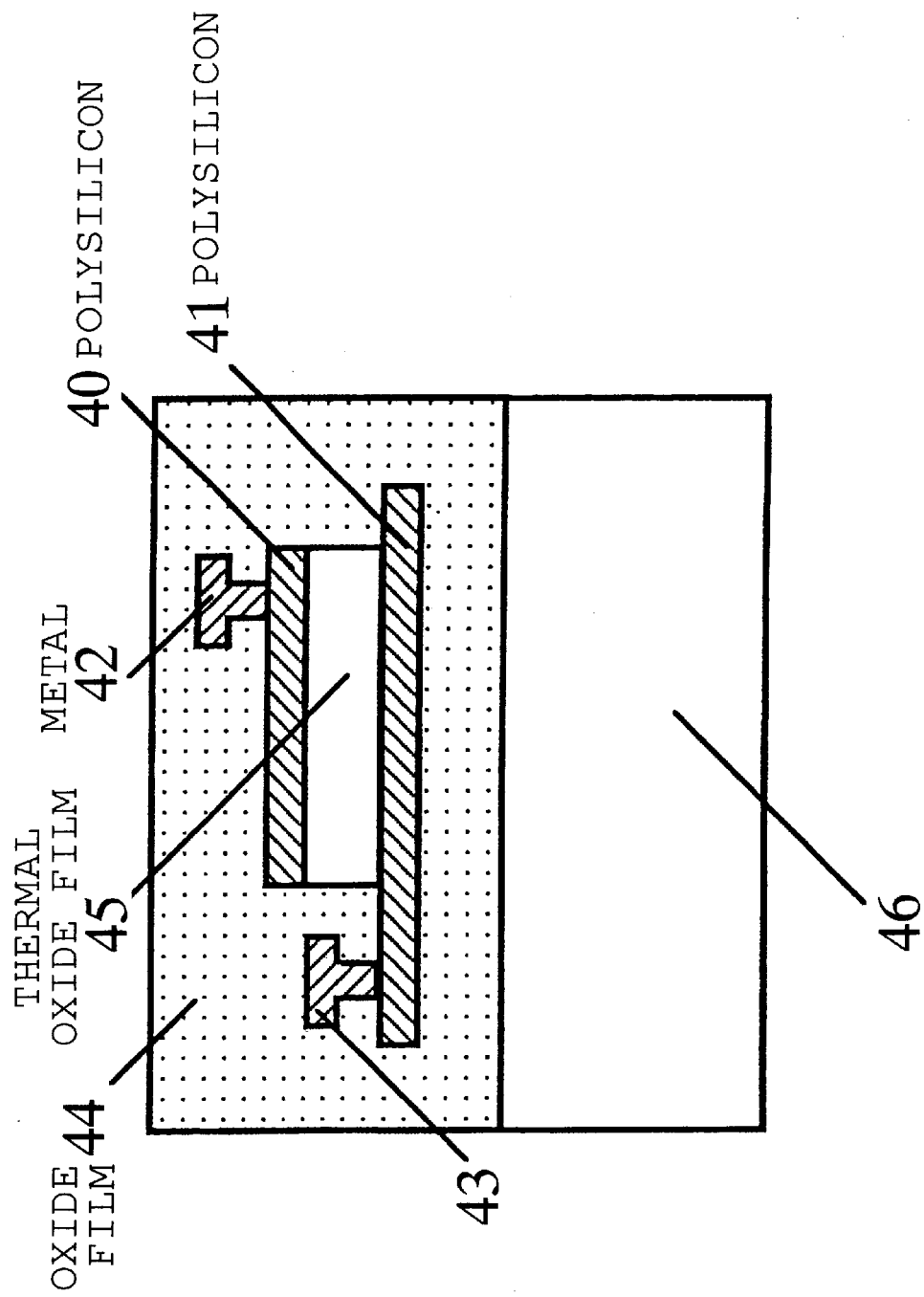
FIG. 4 is a cross-sectional view of a capacitor used in a switched-capacitor amplifier circuit in accordance with the invention.

FIG. 4 is a cross-sectional view of a capacitor used in the present invention. In the cross-sectional view of the capacitor of FIG. 4, the top and bottom electrodes of the capacitor are made of polysilicon. An oxide film between the electrodes is a thermal oxide film having excellent characteristics.

In a switched-capacitor amplifier circuit in accordance with the present invention, if the input voltage varies rapidly, the output voltage can be obtained precisely by connecting two input capacitors in series. Therefore, if the input voltage varies rapidly, the potential at the virtual grounding terminal does not change. Hence, the output can be obtained precisely.

Two signal paths are formed for the input and output, respectively, of an operational amplifier. Consequently, in-phase clock feedthrough and noises can be reduced by the action of in-phase component-removing action of the operational amplifier. This yields great advantages.

Where capacitors having two polysilicon layers are used, an accurate switched-capacitor amplifier circuit can be accomplished, because the dependence on voltage is small.

What is claimed is:

1. A switched-capacitor amplifier circuit having an input terminal comprising:

an operational amplifier having an input terminal and an output terminal;

a first capacitor having a first end connected with the input terminal of said operational amplifier and a second end;

a second capacitor having a first end connected with the input terminal of said operational amplifier and a second end;

a first switching circuit having a first end connected with the input terminal of said operational amplifier and a second end;

a second switching circuit connected with the second end of said first capacitor;

a third capacitor having a first end, connected with the second end of said first capacitor and a second end;

a third switching circuit connected between the second end of said third capacitor and the input terminal of said switched-capacitor amplifier circuit;

a fourth switching circuit connected between the second end of said third capacitor and an analog ground;

a fifth switching circuit connected between the second end of said second capacitor and the output terminal of said operational amplifier;

a sixth switching circuit connected between the send end said second capacitor and an analog ground;

a seventh switching circuit connected between the second end of said first switching circuit and an analog ground; and a fourth capacitor connected between the second end of said first switching circuit and the output terminal of said operational amplifier.

2. A switched-capacitor amplifier circuit having first and second input terminals, comprising:

an operational amplifier having two pairs of input and output terminals including first and second input and output terminals;

a first signal path for the first input and output terminals of said operational amplifier;

a second signal path for the second input and output terminals of said operational amplifier;

each of said first and second signal paths consisting of an input circuit portion and a feedback circuit portion, said input circuit portion consisting of a switch and a capacitor;

said first signal path comprising a first and second capacitors having their respective first end connected with the first input terminal of said operational amplifier, a first switching circuit having a first end connected with the first input terminal of said operational amplifier, a second switching circuit and a third capacitor connected with a second end of said first capacitor, a third switching circuit connected between a second end of said third capacitor and the first input terminal of said switched-capacitor amplifier circuit, a fourth switching circuit connected between the second end of said third capacitor and an analog ground, a fifth switching circuit connected between a second end of said second capacitor and the first output terminal of said operational amplifier, a sixth switching circuit connected between the second end of said second capacitor and an analog ground, a seventh switching circuit connected between a second end of said first switching circuit and an analog ground, and a fourth capacitor connected between the second end of said first switching circuit and one of the output terminals of said operational amplifier; and said second signal path comprising fifth and sixth capacitors having their respective first end connected with the second input terminal of said operational amplifier, an eighth switching circuit having a first end connected with the second input terminal of said operational amplifier, a ninth switching circuit and a seventh capacitor connected with a second end of said fifth capacitor, a tenth switching circuit connected between a second end of said seventh capacitor and the second input terminal of said switched-capacitor amplifier circuit, an eleventh switching circuit connected between the second end of said seventh capacitor and an analog ground, a twelfth switching circuit connected between a second end of said sixth capacitor and the second output terminal of said operational amplifier, a thirteenth switching circuit connected between the second end of said sixth capacitor and an analog ground, a fourteenth switching circuit connected between a second end of said eighth switching circuit and an analog ground, and an eighth capacitor connected between the second end of said eighth switching circuit and the output terminal of said operational amplifier.

3. A switched-capacitor amplifier circuit as claim 1 or 2, wherein each of said capacitors has two layers of polysilicon.

* * * * *